United States Patent [19]
Wu

[11] Patent Number: 5,745,065
[45] Date of Patent: Apr. 28, 1998

[54] LEVEL-SHIFT TYPE DIGITAL TO ANALOG CONVERTER

[75] Inventor: Rong-Tyan Wu, Hsinchu, Taiwan

[73] Assignee: Holtek Microelectronics, Inc., Hsinchu, Taiwan

[21] Appl. No.: 826,694

[22] Filed: Apr. 7, 1997

[51] Int. Cl.$^6$ .................................................. H03M 1/66
[52] U.S. Cl. ................................................................ 341/144
[58] Field of Search ..................................... 341/144, 148, 341/153, 154

[56] References Cited

U.S. PATENT DOCUMENTS

| | | |
|---|---|---|
| 4,607,249 | 8/1986 | Naylor .................................. 341/135 |
| 5,079,552 | 1/1992 | Pelgrom et al. .......................... 341/148 |

*Primary Examiner*—Brian K. Young
*Attorney, Agent, or Firm*—Raymond Sun

[57] ABSTRACT

This present invention relates to a level-shift type digital to analog converter including a selection circuit, a multiple voltage level generation circuit, a stabilization circuit and a level-shift type buffer stage circuit. The multiple voltage level generation circuit is composed by a divided-step voltage output circuit and a level voltage output circuit, for generating a plurality of voltage levels to directly output to a level-shift type buffer stage circuit or alternatively, to be processed through voltage selection in order to respectively output the divided-step voltage output values and the level voltage output values to a level-shift type buffer stage circuit. A stabilization circuit generates a reference voltage or a reference current insensitive to the power supply voltage $V_{DD}$ for other elements of the converter. Finally, the level-shift type buffer stage circuit synthesizes the received divided-step voltage and the level voltage, amplifies them with appropriate times and finally converts them to analog output signals.

10 Claims, 18 Drawing Sheets

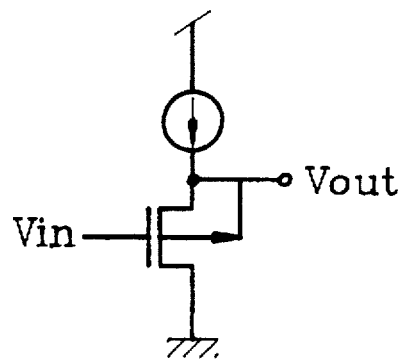
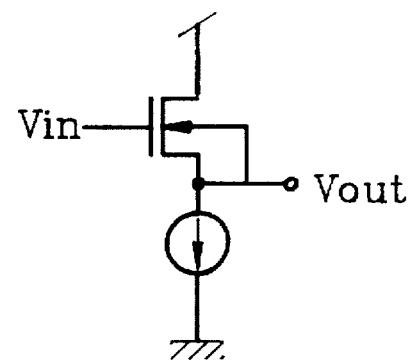
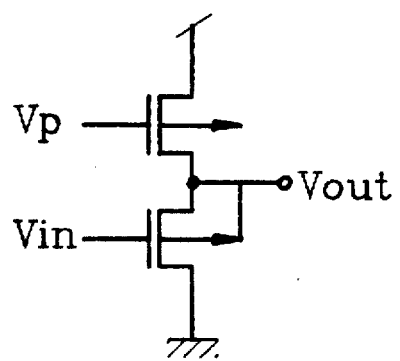
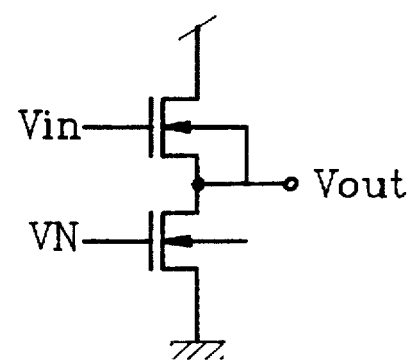
FIG. 9B            FIG. 9C

LEVEL-SHIFT TYPE DIGITAL TO ANALOG CONVERTER

BACKGROUND OF THE INVENTION

1. Field of the Invention

The present invention relates generally to a level-shift type digital-to-analog converter, and in particular, to a digital-to-analog converter which can simplify the conventional complicated circuit design and improve the precision control of the traditional digital-to-analog converter with multiple bits.

2. Description of the Prior Art

A traditional digital-to-analog converter directly input the pre-decoded corresponding codes into a voltage-fetch circuit of a digital-to-analog converter and then obtain the corresponding analog output signals one by one. FIG. 1 is an illustration figure of a conventional digital-to-analog converter which divides voltage segments through the combination of a plurality of R-2R resistors, wherein the reference numerals 10 and 12 denote a multiplex and a buffer respectively. The multiplexer 10 shown in FIG. 1 converts the input to switch control codes, i.e. digital signals, and outputs the switch control codes to control the switches. Additionally, FIG. 2 is an illustration figure of another conventional digital-to-analog converter dividing voltage segments through a plurality of resistors connected in series, wherein the reference numeral 11 is a multiplexer having the same function as the multiplexer 10 in FIG. 1 and the reference numeral 14 is a buffer. As illustrated in FIG. 2, it is necessary to generate 50 sets of corresponding codes first in order to obtain an analog signal of 50 stages. However, a lot of resistors and switches are necessary so that the analog signal output can be obtained from the conversion of corresponding codes. Thus, there is a great need of switches and resistor segments. For example, the serial-resistor voltage-dividing type of digital to analog converter as shown in FIG. 2 needs 50 switches and 49 resistor segments at least to divide the voltage range of 0–4.9V to an analog signal of 50 stages. As for the R-2R type circuit, the characteristics of the elements will effect the precision of R-2R network due to the currents flowing through the switches. While CMOS, PMOS or NMOS elements are utilized as switches, the currents through the MOS elements will be shifted due to the resistive characteristics varying with the change in voltage and temperature so that the output signals of the R-2R network are distorted. Generally speaking, in dividing voltage segments, the precision of R-2R network is worse than that of the serial resistors. And, for the same number of bits utilized, the resistor value and the area MOS occupied in the R-2R network are both much higher than those of the serial-resistor type. That is to say, a traditional digital to analog converter needs a great amount of elements, occupies large circuit area and needs a more complicated circuit to achieve the determined precision. Therefore, the cost increases and the precision effect factors become more difficult to control due to the increasement in the number of elements and the complexity in circuit design.

From the discussion above, it is obvious that there still exist some inconvenience and disadvantages in a conventional digital to analog converter. In particular, the utilization of so many elements in combination increases much manufacturing cost and causes a lot of design problems such as noise interferences and precision control, etc.

SUMMARY OF THE INVENTION

In accordance with the first embodiment of this present invention, an improved multiple voltage level generation circuit is provided instead of a conventional divided-step voltage output circuit. The multiple voltage level generation circuit is composed by a divided-step voltage output circuit and a level-voltage output circuit wherein the two voltage output circuits may be achieved by lots of different implementations. For example, a conventional circuit composed by a 7-bit R-2R network can be modified into a circuit combined by a 5-bit R-2R divided-step voltage output circuit and a 2-bit R-2R level voltage output circuit. Through the combined design of the two different types of voltage output circuits, the complexity of the whole circuit is greatly reduced. And finally incorporated with a level shift buffer stage, an output voltage signal is obtained.

In the second embodiment of this present invention, the improved multiple voltage generation circuit composed by a divided-step voltage output circuit and a level-voltage output circuit is further modified under the same design principle. The difference is that the divided-step voltage output circuit and the level-voltage output circuit are respectively modified into a divided-step current output circuit and a level-current output circuit. Through a conversion circuit, the current output signals are then converted into voltage output signals. And also, finally incorporated with a level shift buffer stage, an output voltage signal is derived.

However, the level-shift type digital to analog converters disclosed in the foregoing two embodiments are adapted to operate precisely under smaller voltage range. In some circuit applications, a large power supply voltage $V_{DD}$ range is necessary. However, there exists a strict limitation on the DC and AC of the output from the digital to analog converter. Under this condition, the digital to analog converter should add a stabilization circuit to stabilize the DC and AC values. Therefore, the inventor further provides a third embodiment for being applied to a larger power supply voltage $V_{DD}$ range.

The objects of the first and the second embodiments of this invention are to provide the voltage output values in need with a divided-step voltage/current output circuit and a level voltage/current output circuit to generate the demanded voltage output value. Such an architecture may solve the problems in conventional digital to analog converter design due to a large number of circuit elements utilized and the complexity, such as noise caused by environments, the difficulty in controlling the precision, and the burden in manufacturing cost, etc. With the embodiments disclosed in this present invention, both the manufacturing cost and the complexity of the circuit design are decreased a lot.

Another object of the first embodiment of this present invention is to provide the demanded output voltage signal with a level-shift type buffer circuit for processing the voltage values output from the divided-step voltage output circuit and the level-voltage output circuit.

Another object of the second embodiment of this present invention is to provide the demanded output voltage signal with a converting circuit for converting the current signals output from the divided-step current output circuit and a level-current output circuit to voltage signals and then with a level-shift type buffer circuit for processing the foregoing voltage signals output from the converting circuit.

The objects of the third embodiment of this invention is to provide a circuit implemented in a larger power supply voltage $V_{DD}$ range. The circuit architecture of the third embodiment combines the level voltage generation circuit and the divided-step voltage generation circuit to a multiple voltage level generation circuit and then, utilizes a voltage level selection circuit inside a selection circuit to provide level voltage input and divided-voltage input to a level-shift type buffer circuit.

BRIEF DESCRIPTION OF THE DRAWINGS

FIG. 9B and 9C illustrate the circuit diagrams of the power supply follower of the input stage shown in FIG. 9A.

DETAILED DESCRIPTION

Figure 3:
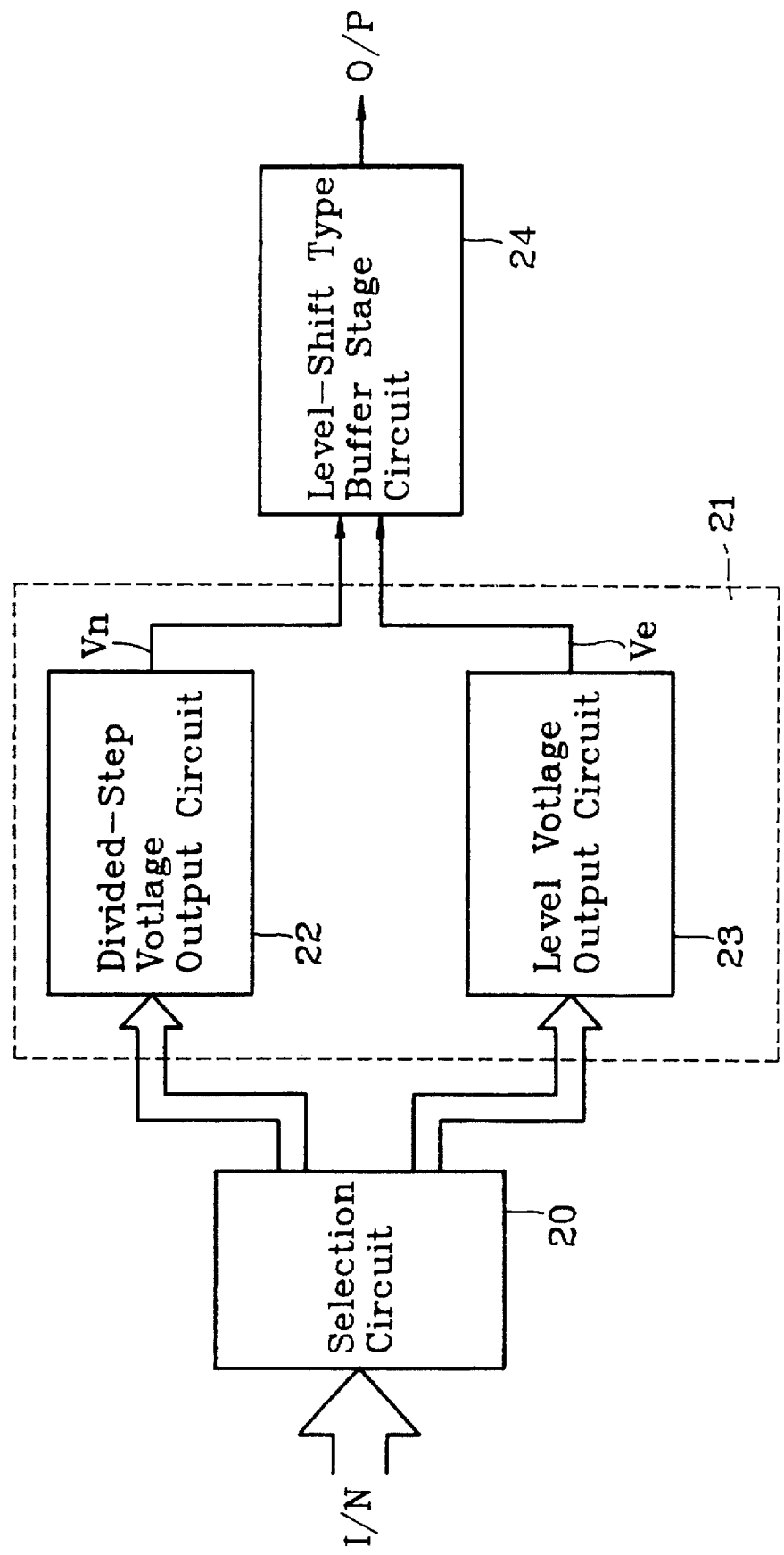
FIG. 3 is a circuit block diagram of the first embodiment according to this present invention.

As shown in FIG. 3 is the circuit block diagram according to the first embodiment of this present invention, which includes a selection circuit 20, a multiple voltage level generation circuit 21, a level-shift type buffer stage circuit 24. The multiple voltage level generation circuit is composed by a divided-step voltage output circuit 22 and a level voltage output circuit 23. As for the divided-step voltage output circuit 26 and the level voltage output circuit 28, the number of voltage steps, the number of levels and the voltage difference at each step can be respectively designed and planned by user. A design principle for reference is provided below with the following parameters that $V_n(S)$ is the output voltage value of the divided-step voltage output circuit wherein S is the number of the steps;

$V_e(X)$ is the output voltage value of the level voltage output circuit wherein X is the number of the levels;

O/P is the final output voltage value of the synthesized circuit of the divided-step voltage output circuit and the level voltage output circuit.

If the voltage range 0~4.9V is to be divided into 50 steps, the number of the steps S can be selected as 10 and the number of the levels X is 50/10 =5. That is to say, S=0, 1, 2, 3, . . . , 8, 9, and, X=0, 1, 2, 3, 4. The step voltage difference from the step voltage output circuit is then determined as 0.1V, and the level voltage difference of the level voltage output circuit is 1V. Therefore, the following equations are obtained:

$V_n(S)=0.1V \times S$, and $V_e(X)=1V \times X$.

For example, the demanded voltages 3.5V and 0.8V can be derived through the equation $O/P=V_n(s)+V_e(X)$ respectively as follows:

$$3.5V = V_n(5) + V_e(3)$$

$$0.8V = V_n(8) + V_e(0).$$

As illustrated in FIG. 3, the selection circuit 20 converts the original digital values to the digital codes for the digital to analog converter, and then respectively output the digital code signals to the step voltage output circuit 22 and the level voltage output circuit 23. The divided-step voltage output circuit 22 and the level voltage output circuit 23 respectively output a voltage signal to the level shift type buffer stage circuit 23 according to the input signal from the selection circuit 20, the predetermined number of steps, the predetermined number of levels, and the voltage differences at each step and each level. The level-shift type buffer stage 23 further processes the voltage signals as described in the following paragraphs and then outputs the analog voltage output signals.

Figure 4:
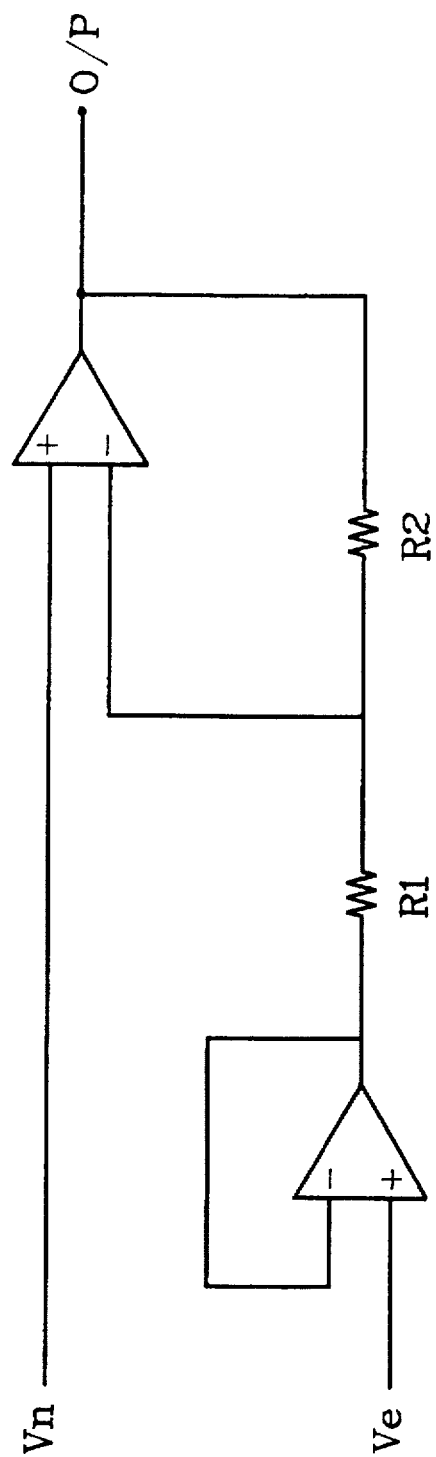
FIG. 4 is a circuit diagram of the level-shift type buffer stage circuit of the first embodiment according to this present invention.

Now, FIG. 4 shows the circuit diagram of the level-shift type buffer stage according to the first embodiment of this present invention, wherein $V_n$ is the voltage value output from the divided-step voltage output circuit, $V_e$ is the voltage value output from the level voltage output circuit, and $V_n = V_{nAC} + V_{nDC}$. $V_{nAC}$ is the alternate current signal output from divided-step voltage output circuit and $V_{nDC}$ is the direct current signal output from divided-step voltage output circuit, and $V_e = V_{eDc}$ wherein $V_{eDc}$ is the direct current signal output from the level voltage output signal.

Through the operation as illustrated in the figure, $V_O = (1+R2/R1)V_{nAC} + [(1+R2/R1)V_{nDC} - (R2/R1)V_{eDc}]$, wherein $(1+R2/R1)V_{nAC}$ is an alternate current signal and $[(1+R2/R1)V_{nDC} - (R2/R1)V_{eDc}]$ is a direct current signal. Therefore, through adjustment of the resistor values R1 and R2 and the voltage signal value $V_e$ output from the level voltage output circuit, the output voltage $V_O$ is obtained.

Figure 5:
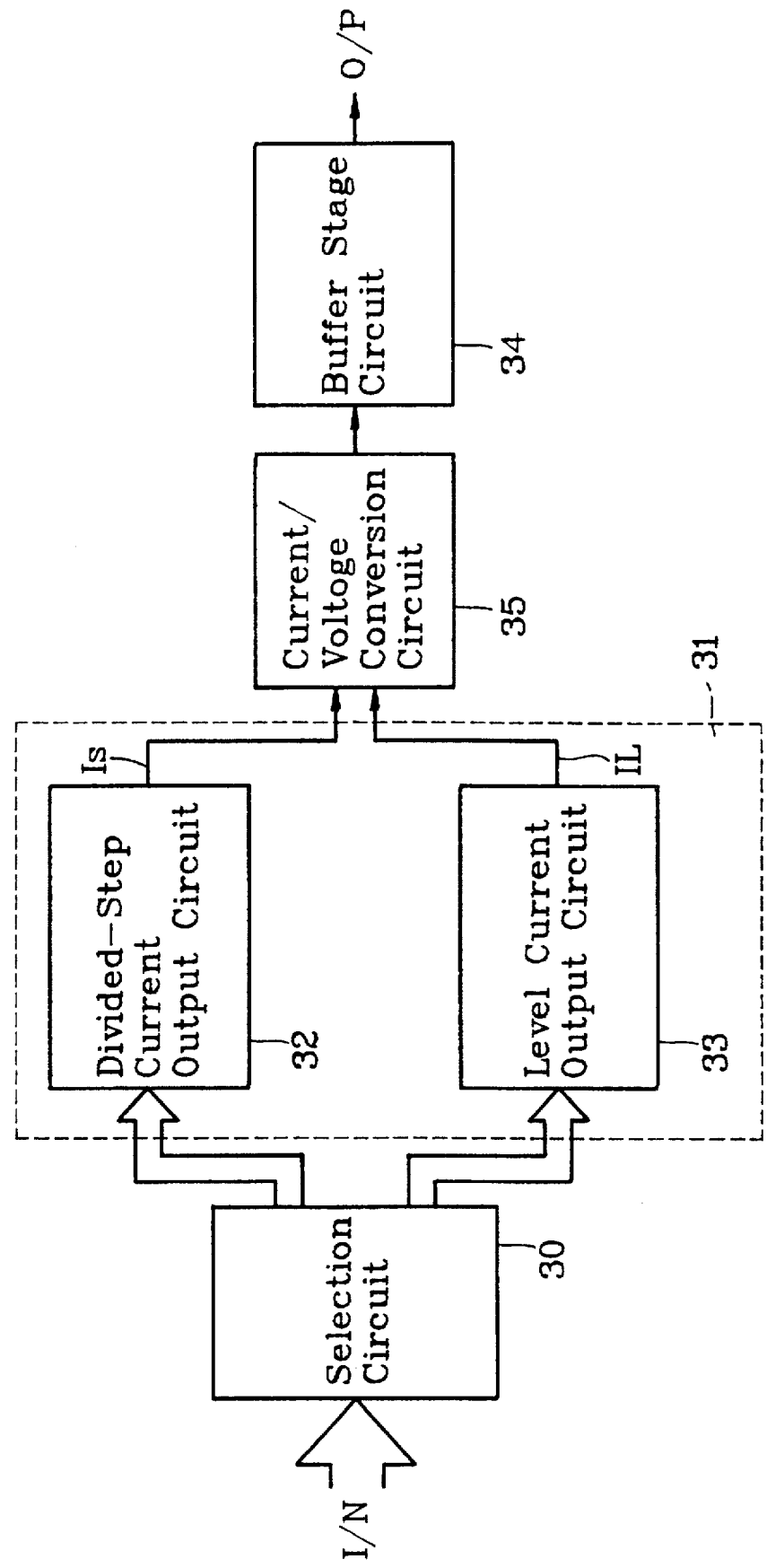
FIG. 5 is a circuit block diagram of the second embodiment according to this present invention.
Figure 6:
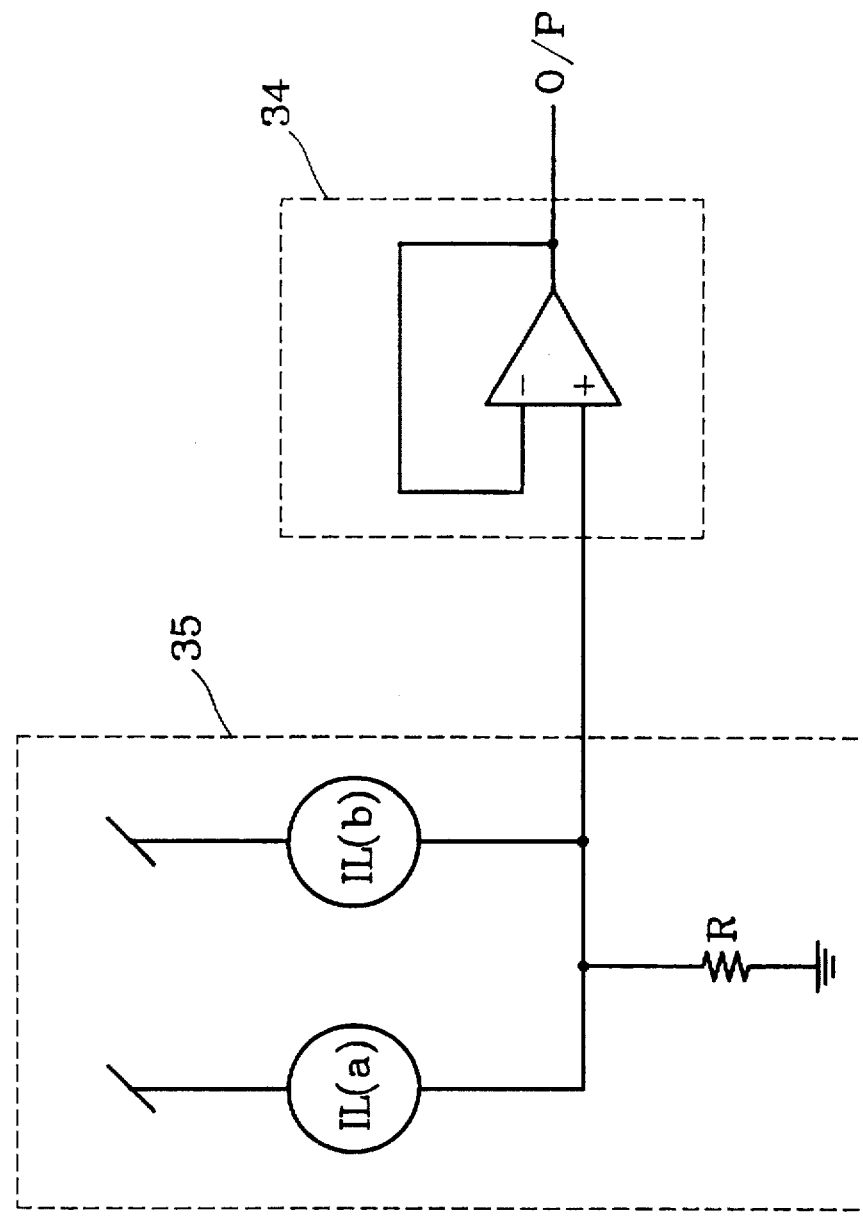
FIG. 6 is a diagram illustrating the output voltage generated by the second embodiment according to this present invention.

FIG. 5 shows the circuit block diagram according to the second embodiment of this present invention, which includes a selection circuit 30, a multi-current generation circuit 31, a current/voltage conversion circuit 35 and a buffer stage circuit 34. The multi-current generation circuit 31 is composed by a divided-step current output circuit 32 and a level current output circuit 33. As for the operations regarding the demanded numbers of steps and levels respectively generated by the divided-step current output circuit 32 and the level current output circuit 36 are not redundantly described here since the principle of the operations are the same as described above in the first embodiment of this present invention. And, the demanded output voltage O/P generated in this second embodiment of this present invention is illustrated below referring to FIG. 6 and the related parameters are defined as follows:

IL(a):the current value output from the level current circuit, a:the number of levels;

Is(b):the current value output from the divided-step current circuit, b:the number of steps;

R:utilized as the current/voltage converter;

O/P:the voltage value output from this embodiment and the O/P=[IL(a)+I_S(b)]×R.

For example, the voltage range is also designed as 50 steps, and then a=0, 1, 2, 3, 4; and b=0, 1, 2, 3, . . . , 8, 9. The current value difference at each level of the level current output circuit is defined as $\Delta I_L$ and, the current value difference at each step of the step current output circuit is $\Delta I_S$, equal to $\Delta I_L/10$. The following two equations are obtained:

$$I_L(z+1)=I_L(z)+\Delta I_L, z=0, 1, 2, 3, 4;$$

$$I_S(w+1)=I_S(w)+\Delta I_S, w=0, 1, 2, 3, \ldots, 7, 8$$

wherein $\Delta I_L$ and $\Delta I_S$ are fixed values.

As illustrated in FIG. 5, the divided-step current output circuit 32 and the level current output circuit 33 respectively output a current signal to the current/voltage conversion circuit 35 according to the predetermined levels, steps, the current value difference at each step and the current value difference at each level. The current/voltage conversion circuit 35 converts the combined current values to voltage values and then output to the buffer stage circuit 34. The buffer stage circuit 34 further processed the voltage values and then output the demanded analog voltage output signal.

Figure 7:
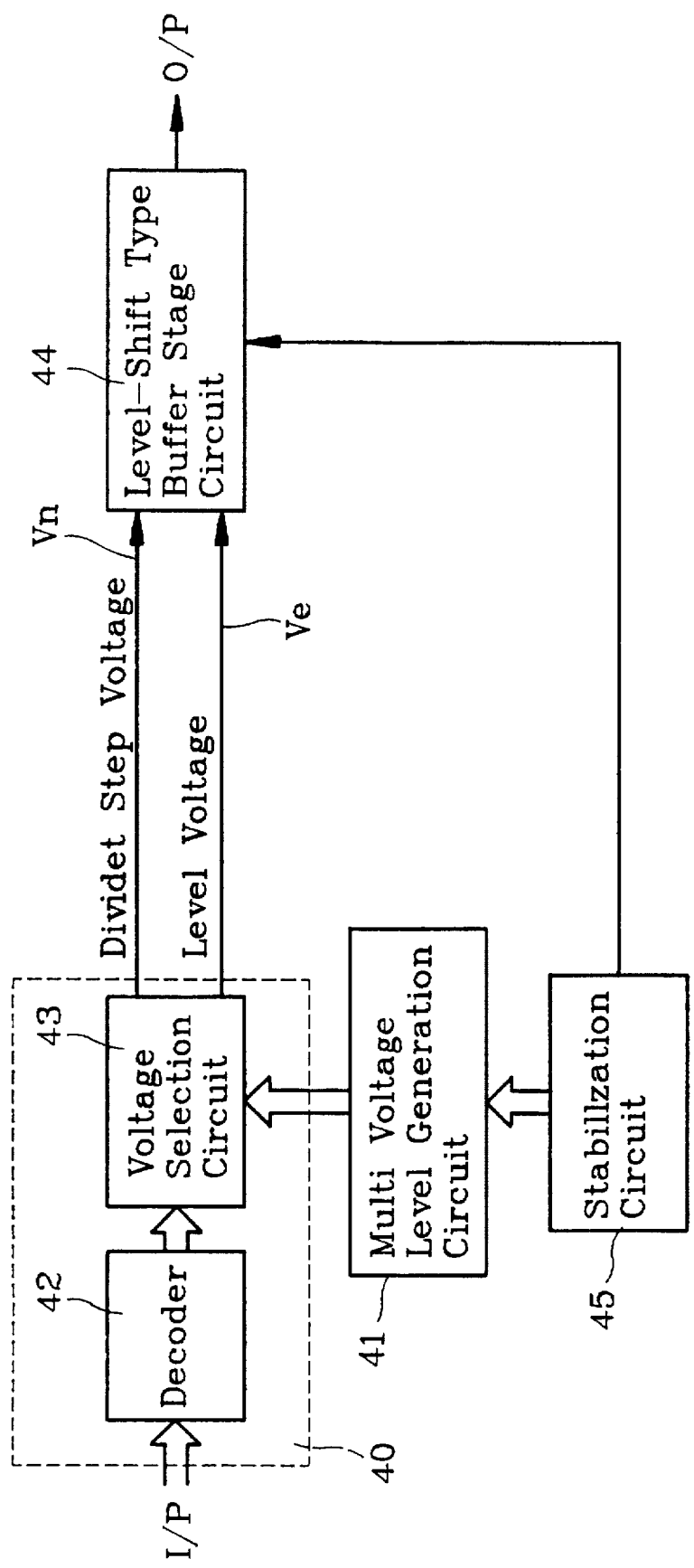
FIG. 7 is a circuit block diagram of the third embodiment according to this present invention.

As illustrated in FIG. 7, the third embodiment of this present invention includes a selection circuit 40, a multiple voltage level generation circuit 41, a stabilization circuit 45 and a level-shift type buffer stage circuit 44. The selection circuit is composed by a decoder 42 and a voltage level selection circuit 43. The decoder receives digital output signals I/P first and then converts the signals I/P to the signals of a format receivable by the voltage level selection circuit 43. The voltage level selection circuit 43 receives the signals from the multiple voltage level generation circuit 41 composed by a decoder 42, a level voltage generation circuit and a divided -step voltage generation circuit. The voltage level selection circuit 43 then outputs the appropriate divided-step voltage output value and the level voltage output value Ve for being provided to the level-shift type buffer stage circuit 44.

The circuit 41 is utilized to generate multiple voltage levels for voltage selection. The stabilization circuit 45 is provided for generating at least an insensitive reference voltage or an insensitive reference current so that other components may use. The level-shift type buffer stage circuit synthesizes the divided-step voltage and the level voltage from the voltage level selection circuit 43, amplifies or shrinks it with appropriate times or remains the same, and then converts it to an analog output signal O/P.

Figure 8:
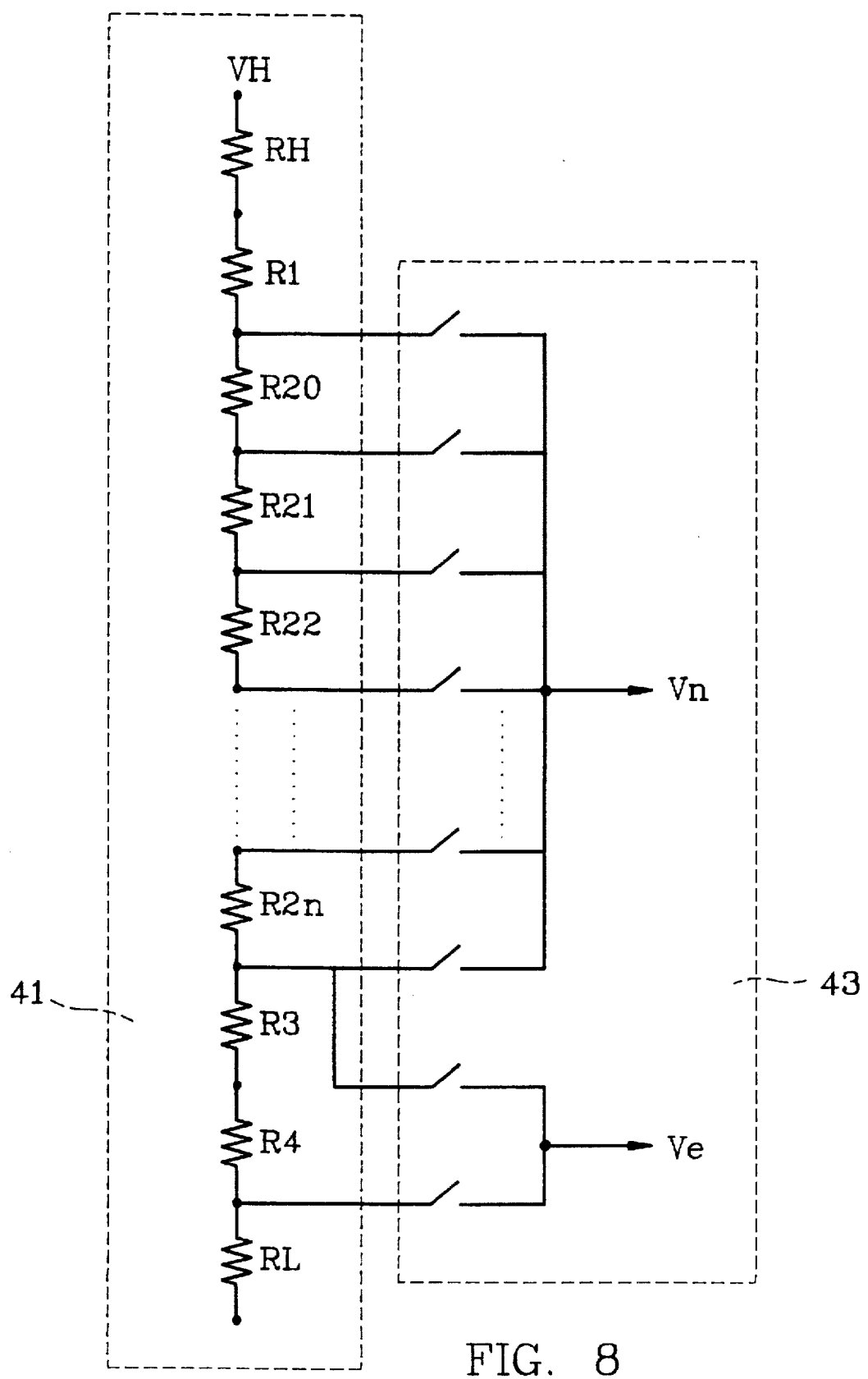
FIG. 8 illustrates the internal circuits and the connection relation between the voltage selection circuit and the multiple voltage level generation circuit shown in FIG. 7.

FIG. 8 illustrates the internal diagram and the connection way of the voltage level selection circuit 43 and the multiple voltage level generation circuit 41 as shown in FIG. 7. The multiple voltage level generation circuit 41 for generating a plurality of voltages of different levels, includes a serial circuit composed by a plurality of resistors connected in series. The two terminals of the serial circuit is connected between a high voltage potential and a low voltage potential wherein $$R1 = R3 = R4 = \sum_{m=0}^{n} R2_m \sigma.$$

The resistor values of RH and RL can be adjusted appropriately to control the AC and DC values. In this embodiment the number of the levels is two and the output is amplified two times. The voltage level selection circuit 43 includes a plurality of switch elements wherein the on/off status is controlled by a decoder so that the output terminal can output the divided-step voltage output values and the level voltage output values in demand.

Figure 9A:
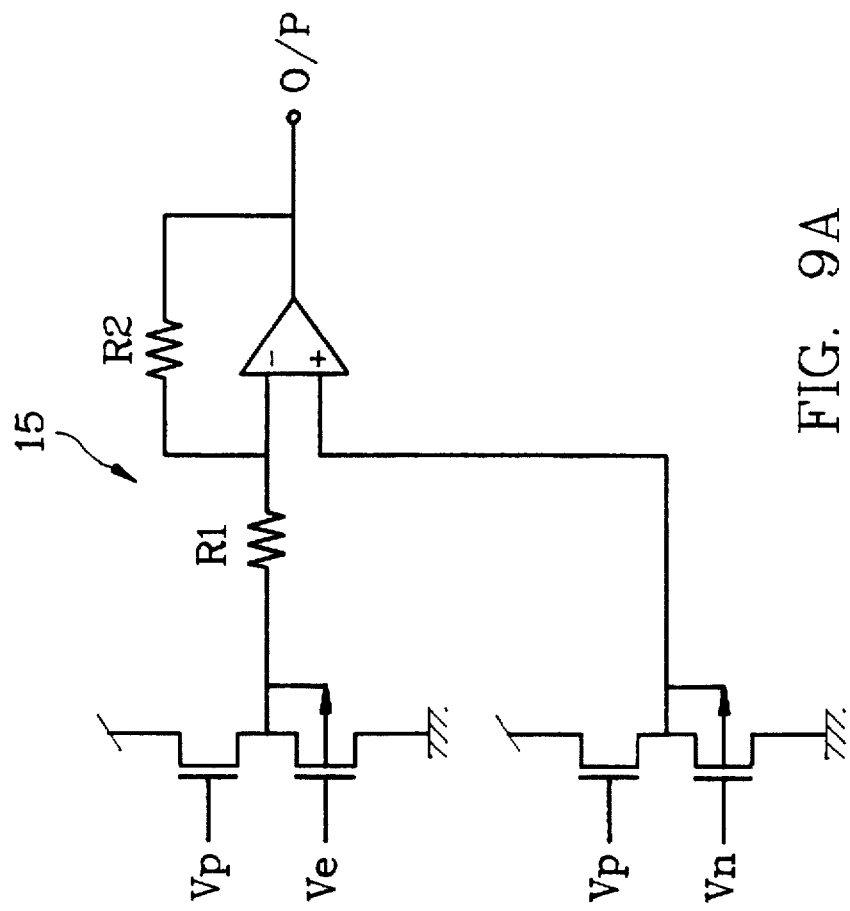
FIG. 9A shows the circuit diagram according to another embodiment of the level-shift type buffer stage circuit.

FIG. 9A shows the circuit diagram of another embodiment of the level-shift type of buffer circuit. The circuit structure shown in FIG. 9A is mainly the same as the circuit shown in FIG. 4. The difference is in that the input portion of the divided-step voltage output value $V_n$ and the level voltage output value $V_e$ respectively includes an input stage circuit composed by two PMOS elements. FIG. 9B shows the circuit diagram of a source follower utilized as the above-mentioned input stage circuit. FIG. 9C illustrates the circuit diagram of a source follower composed by NMOS transistors.

Figure 10B:
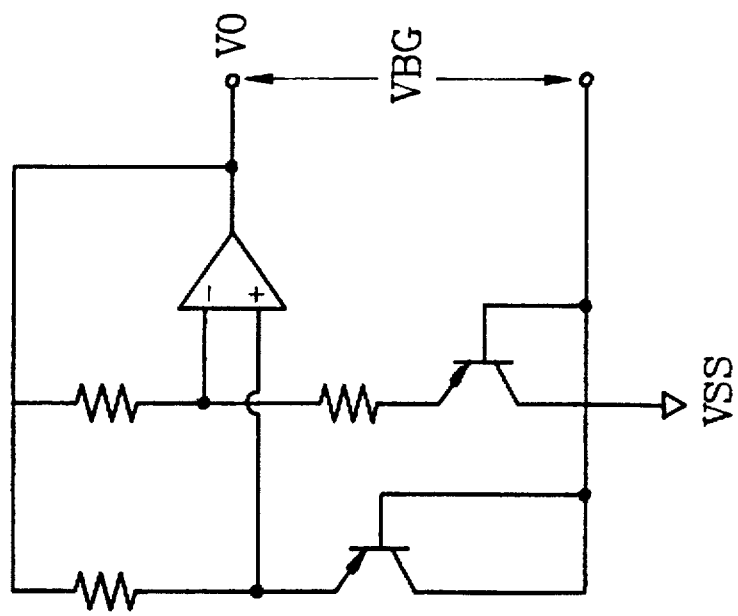
FIG. 10B shows the circuit diagram according to an embodiment of this present invention, which illustrates that the voltage $V_{BG}$ provided to the device providing bandgap reference of fixed value, is derived from the difference between the output voltages $V_O$ and $V_{SS}$.
Figure 10A:
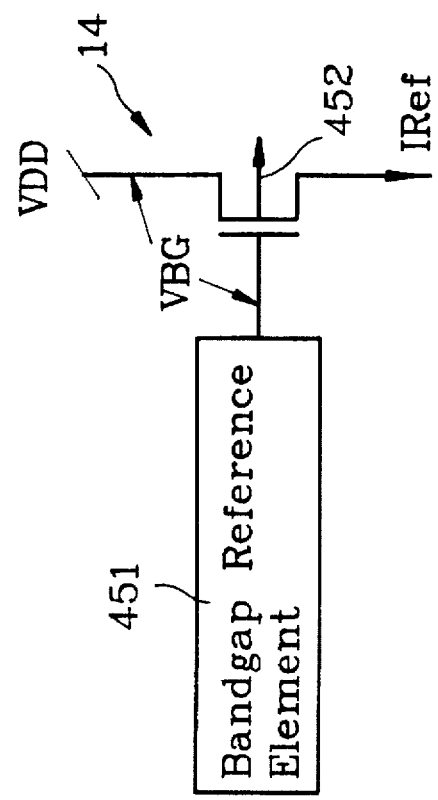
FIG. 10A illustrates the stabilization circuit diagram according to the first example of the third embodiment of the present invention.
Figure 10D:
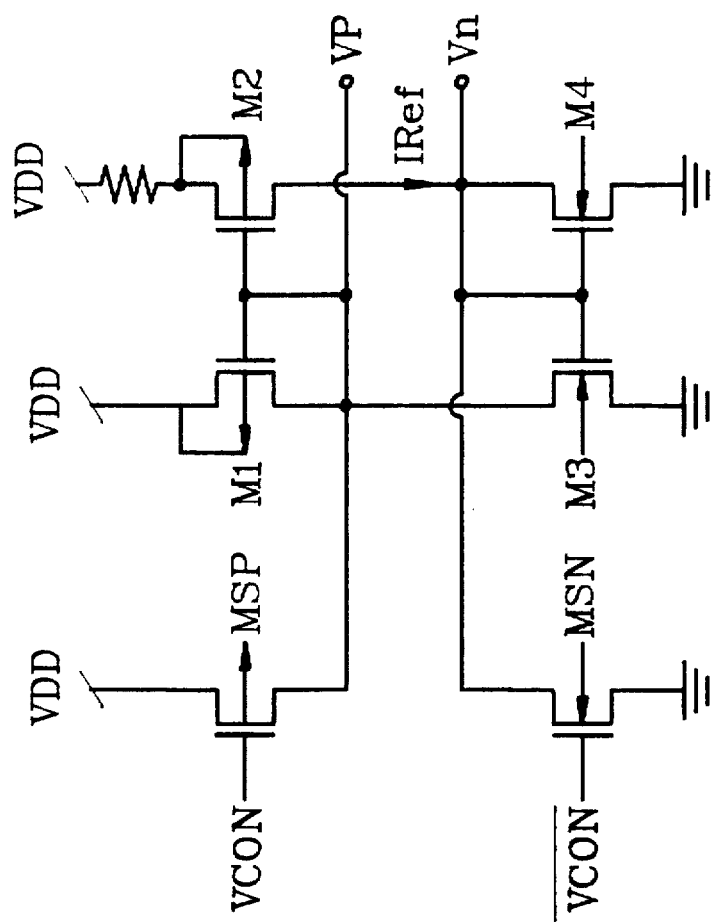
FIG. 10D shows a second example of the stabilization circuit diagram according to the third embodiment of this present invention.
Figure 10C:
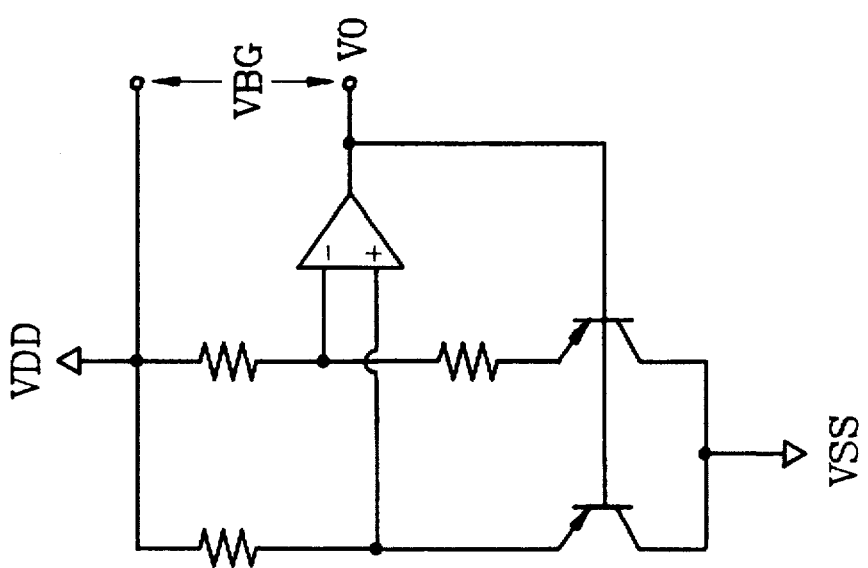
FIG. 10C shows the circuit diagram according to another embodiment of this present invention, which illustrates that the voltage $V_{BG}$ provided to the device providing bandgap reference of fixed values, is derived from the difference between the output voltages $V_O$ and $V_{SS}$.
Figure 10E:
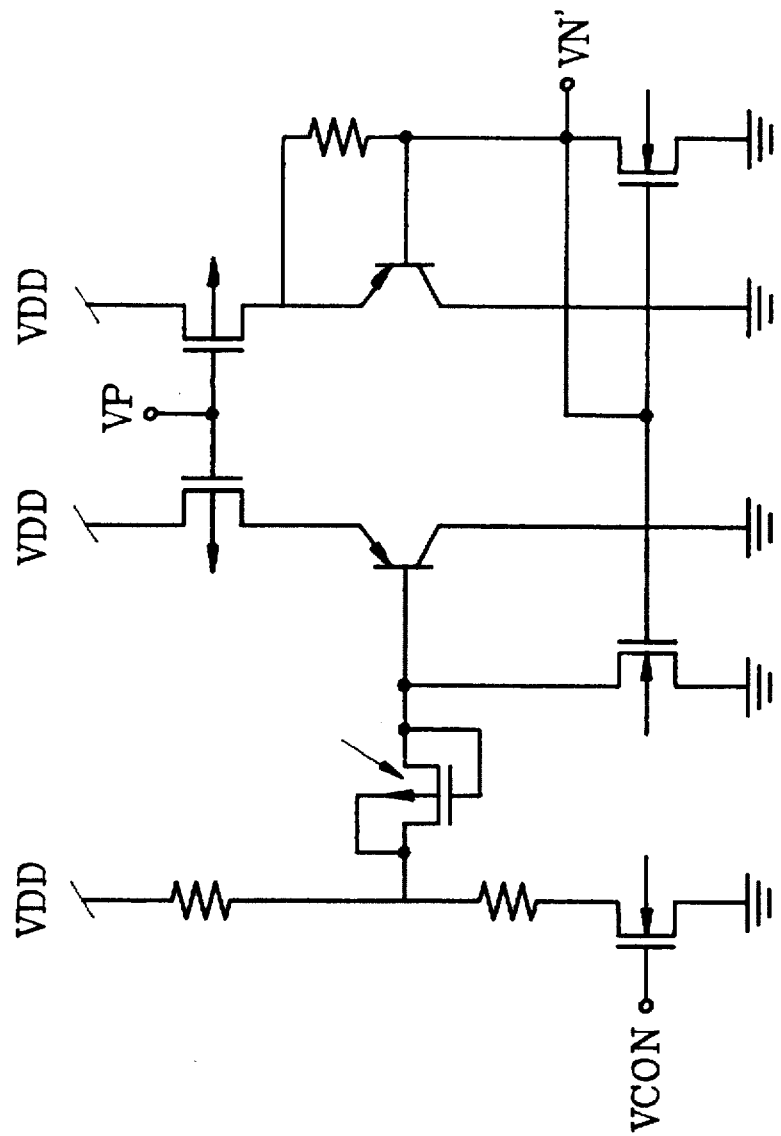
FIG. 10E illustrates the circuit for increasing the stability of the stabilization circuit according to the third embodiment of this present invention.

FIG. 10A to FIG. 10F show different examples of the stabilization circuit 45 according to this present invention. FIG. 10A shows the first example of the stabilization circuit (45) according to this present invention. This example includes a bandgap-reference element 451 and a PMOS element 452. This circuit utilizes the fixed reference of the bandgap to form a stable voltage level $V_{BG}$ which does not vary with $V_{DD}$. $V_{BG}$ could be different as the process variation, and usually the value of $V_{BG}$ is within the range 1.2V to 1.3V. FIG. 10B shows the circuit diagram that $V_{BG}$ is the difference of the output voltage $V_O$ and $V_{SS}$. FIG. 10C shows the circuit diagram that $V_{BG}$ is the difference of the output voltage $V_O$ and $V_{DD}$. When $V_{BG}$ is fixed, the current $I_{Ref}$ is a fixed value which is a constant current source. With a current mirror for example, the constant current source can be fetched for reference.

Figure 10F:
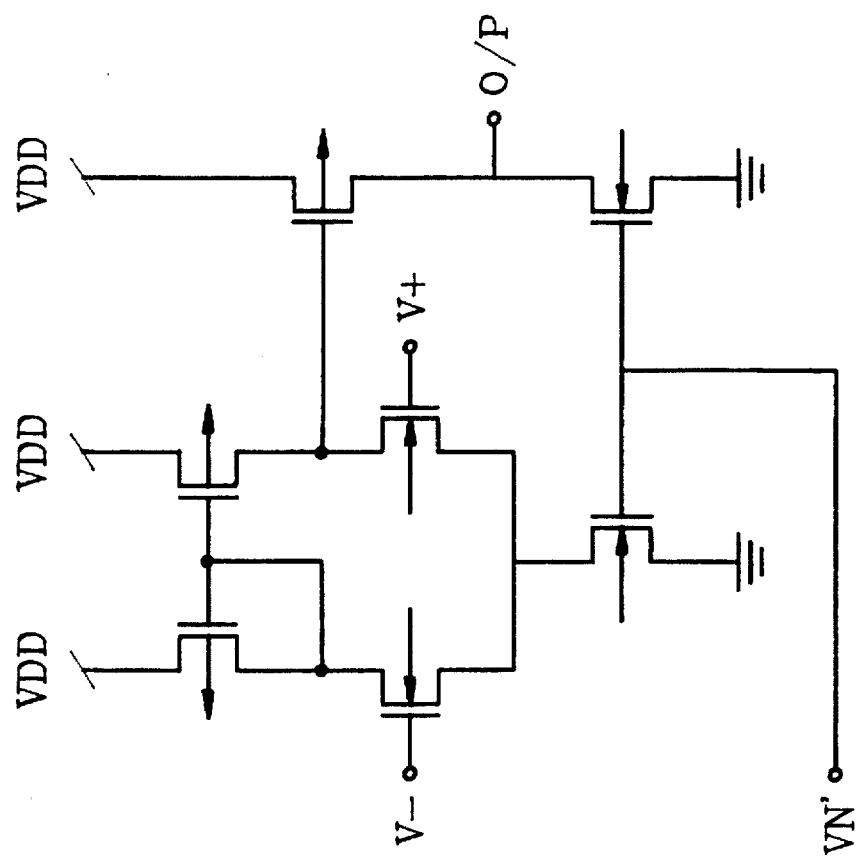
FIG. 10F is an exemplary circuit diagram of an operational amplifier.
Figure 10G:
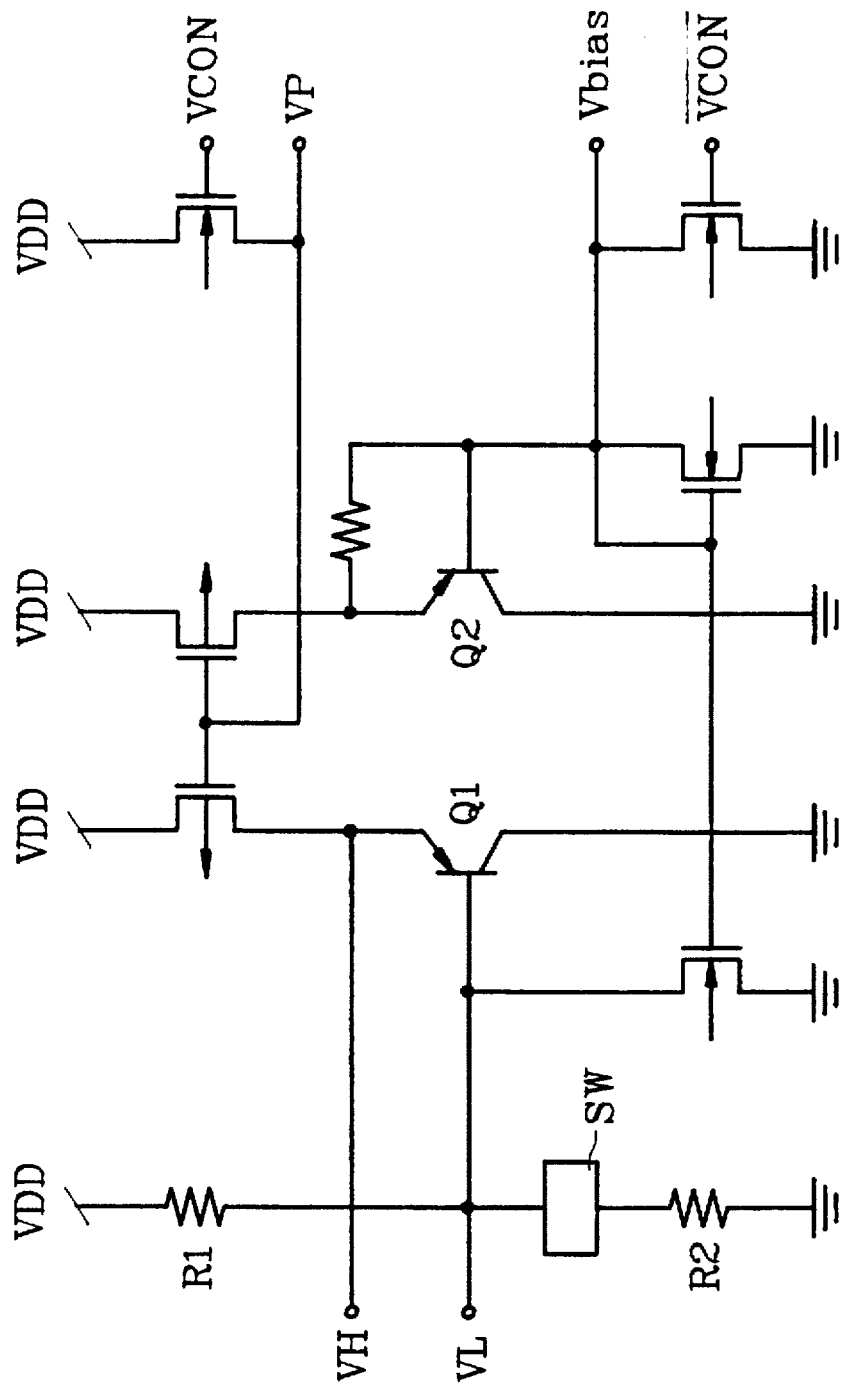
FIG. 10G is a third example of the stabilization circuit diagram according to the third embodiment of this present invention.

FIG. 10D is the circuit diagram of the second example of the stabilization circuit 45 of this present invention wherein the self-bias reference technique is used. The PMOS elements M1, M2, M3 and M4 comprise a self-bias reference current source circuit for reducing power consumption at power-down state and, $M_{sp}$ and $M_{sn}$ are respectively controlled by the control reference voltage Vcon and its inverse voltage /Vcon. As shown in the figure, the reference current Iref is an insensitive current reference source, wherein a current mirror can be obtained through the connection of the output voltage $V_P$ to the gate of the PMOS of the connection of $V_N$ to the gate of the NMOS. Thus, a stable current source is obtained. For further increasing the stability of the stabilization circuit, the output voltage $V_P$ can be fetched to be connected to the circuit in FIG. 10, and then the output value $V_N$ is utilized to compose a current mirror. Therefore, in the circuit diagram shown in FIG. 10E, for increasing the stability of the stabilization circuit according to the embodiment of this present invention, if there are MOS elements $M_x$ connected in the circuit, this type of circuit is especially adapted to a buffer stage circuit composed by a source follower as illustrated in FIG. 9; if the MOS elements $M_X$ are deleted from the circuit, this type of circuit is especially adapted to a buffer stage circuit composed by operational amplifiers as illustrated in FIG. 4. FIG. 10F is a circuit diagram of an example of an operational amplifier for amplifying the input value $V_N$ and outputting an output voltage O/P. In addition, the $V_N$, $V_{N'}$ or $V_P$ applied to the current source of the operational amplifier or the source follower of the output buffer stage as shown in FIG. 4 or 9A, can be connected as a current mirror so that the characteristics of the operational amplifier or the source follower will not vary with $V_{DD}$ a lot.

Figure 1:
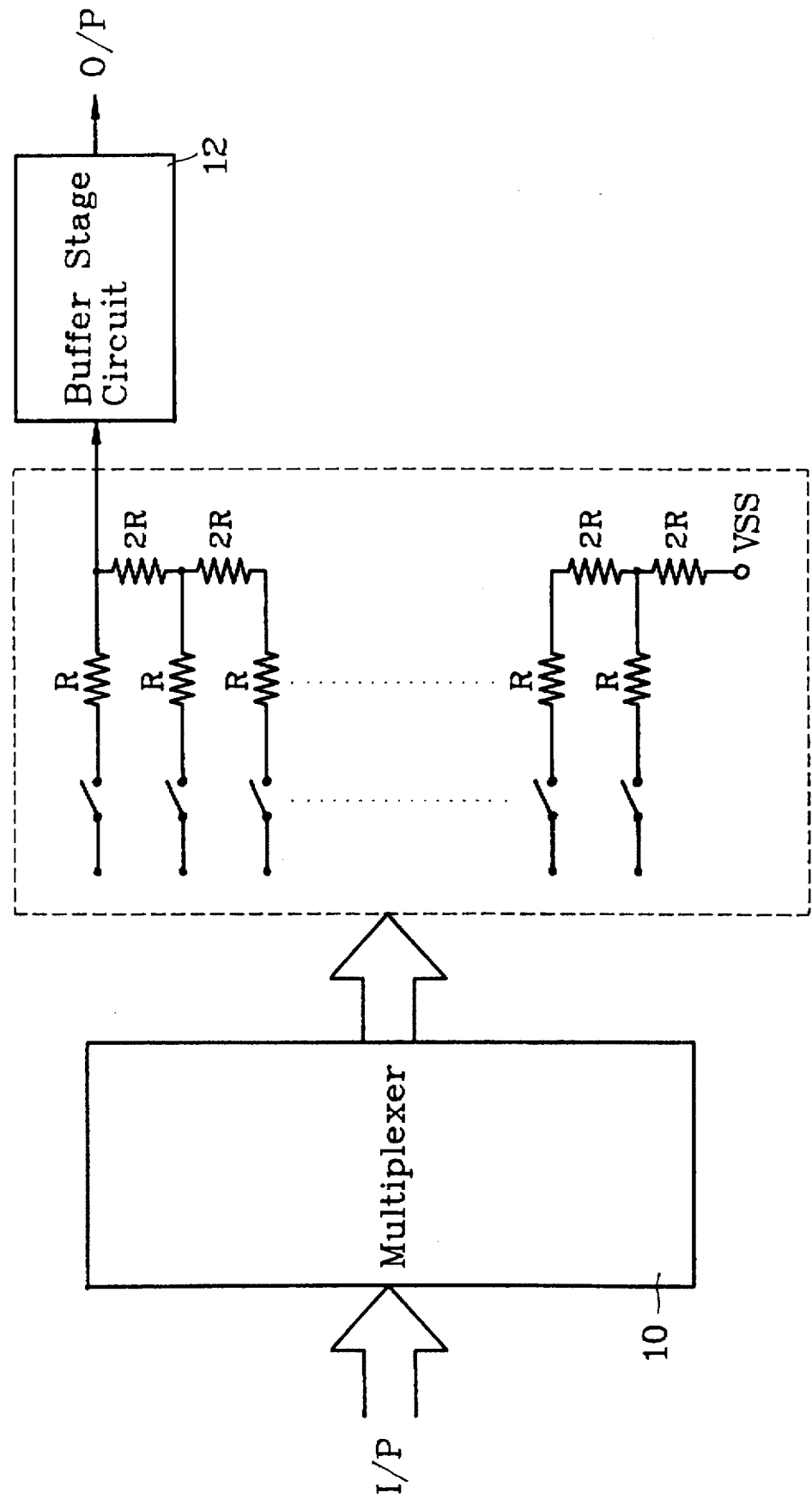
FIG. 1 is a diagram illustrating a conventional digital to analog converter.
Figure 2:
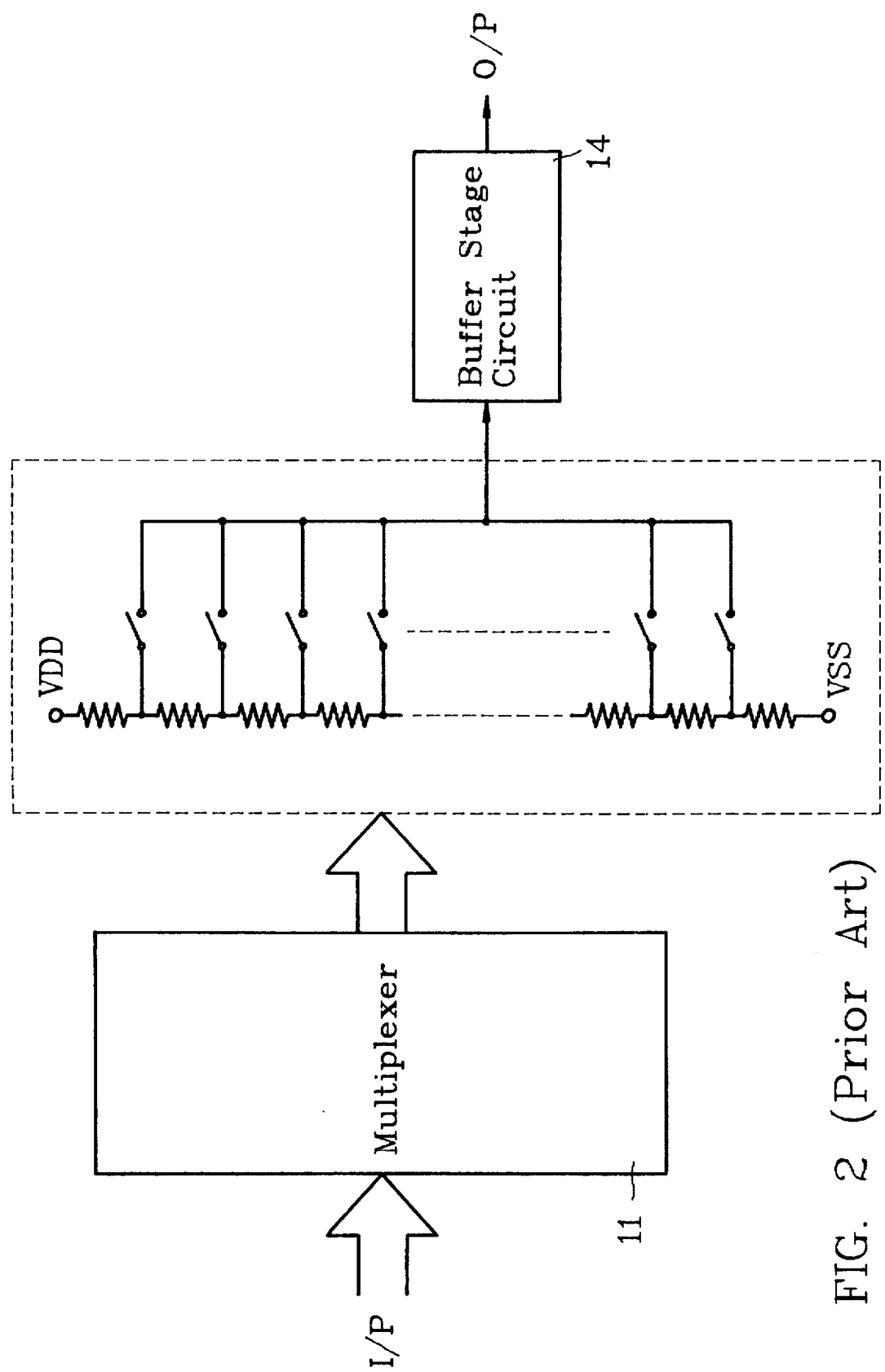
FIG. 2 is a diagram illustrating another conventional digital to analog converter.

In addition, the above-mentioned stabilization circuit can be further improved. As the third example shown in FIG. 10, the difference between $V_H$ and $V_L$ is the emitter-base voltage $V_{BE}$ of the transistor Q1, which is a constant voltage source for the voltage input provided to the multiple voltage level generation circuit 41 shown in FIG. 1. The peak-to-peak output voltage value $V_{p-p}$ is thus stabilized and, the voltage level $V_{bias}$, instead of the $V_N$ as the example discussed in the last paragraph, can be used as the bias voltage source of the current source of the operational amplifier.

In practice, the voltage levels are connected to the two terminals, correspondingly marked as the symbols $V_H$ and $V_L$, of the serial resistors of the multiple voltage level generation circuit 41 shown in FIG. 8. This circuit can maintain the stabilization of the DC voltage level so that the DC voltage will not exceed the permitted error range due to the current variation flowing through the transistors. The current flowing through the transistors is affected by the variation line process parameters, shift, temperature, etc.

Figure 10H:
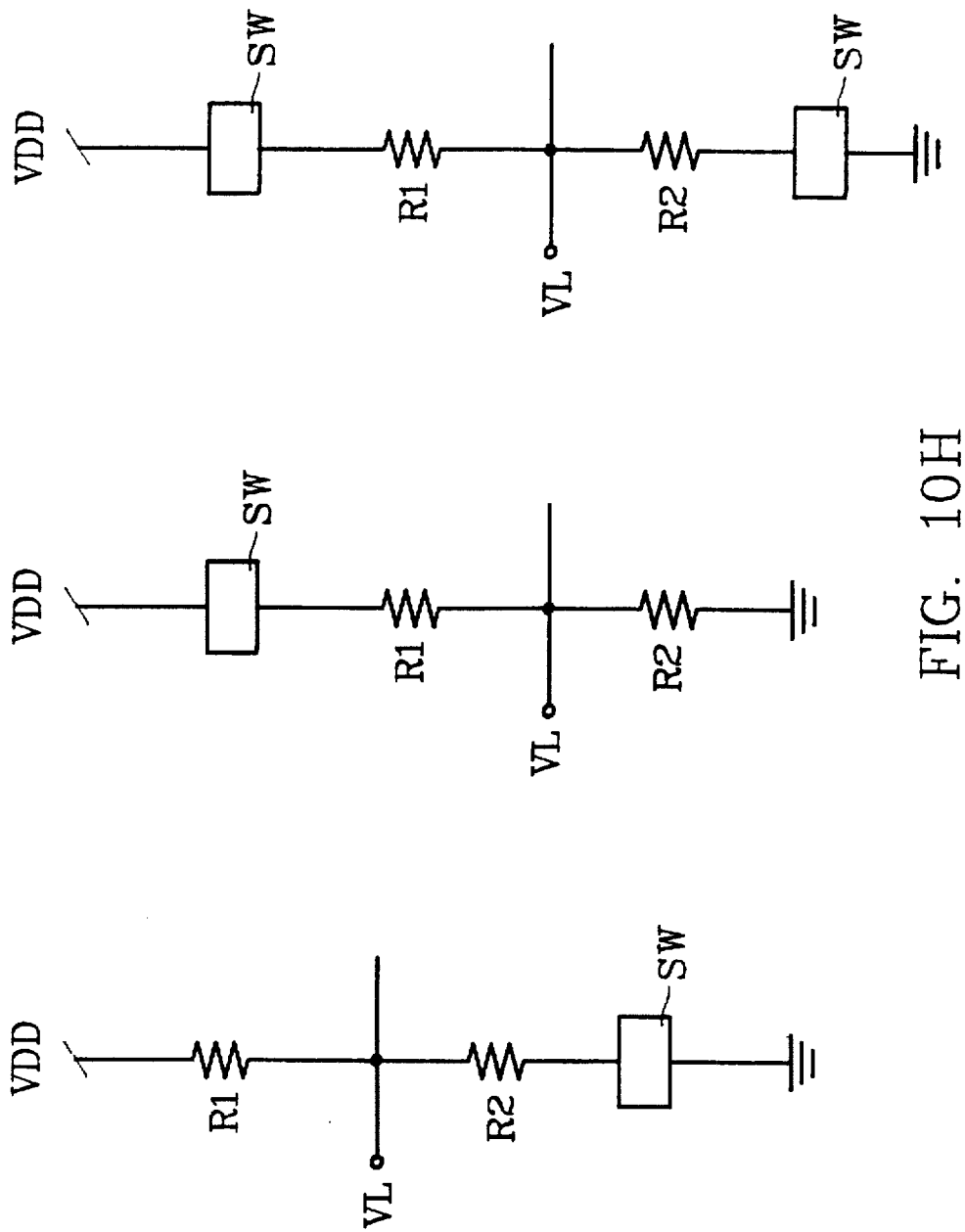
FIG. 10H shows a plurality of other exemplary bias circuits, which are used in FIG. 10G, composed by a switch element SW and registers R1 and R2.
Figure 11A:
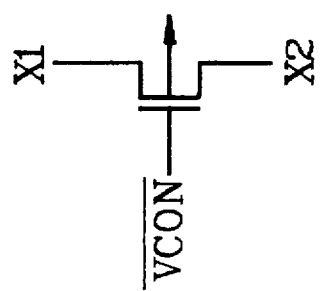
FIG. 11A through FIG. 11D show kinds of switch circuits utilized in the switch elements shown in FIG. 10.
Figure 11B:
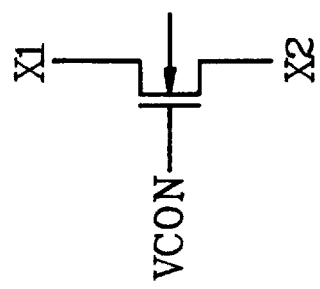
Figure 11C:
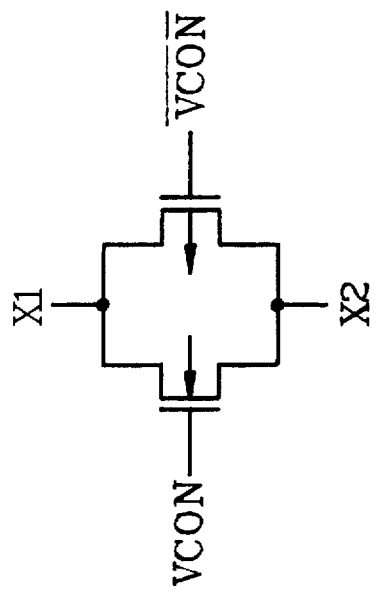
Figure 11D:
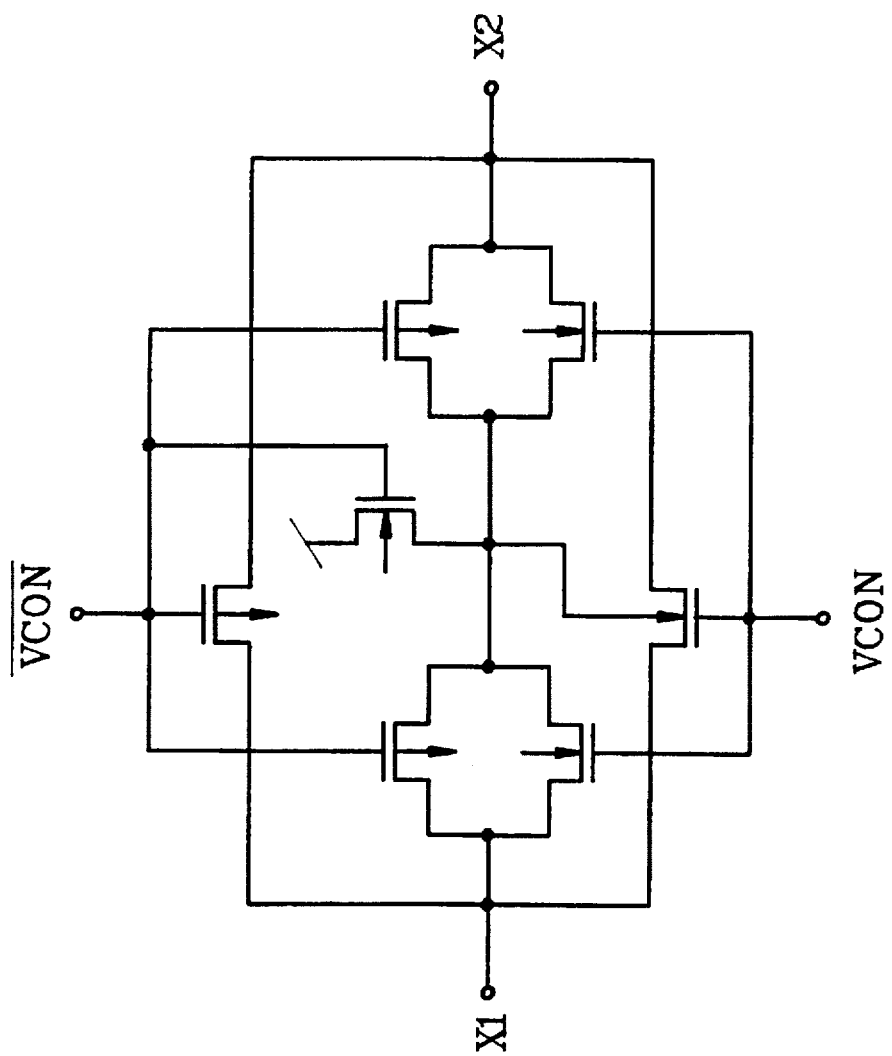

And, as shown in FIG. 10H, there are a lot of different combination ways for the bias voltage $V_L$ circuit design composed by the switch element SW and the resistors R1 and R2. The switch element SW can be implemented in many different ways as examplarily shown in FIG. 11A through FIG. 11D, wherein FIG. 11A is a PMOS switch circuit, FIG. 11B is a NMOS switch circuit, FIG. 11C is a CMOS switch circuit and FIG. 11D is an analog switch circuit. The analog switch circuit as shown in FIG. 11D is implemented on the P-well process. That is to say, the NMOS substrate is connected to the two terminals X1 and X2 of the switch while the analog switch is turned on and, connected to $V_{DD}$ while the analog switch is turned off.

From the discussion above, compared with conventional digital-to-analog converters, the level-shift type digital-to-analog converter according to this present invention has the following advantages.

(1) This present invention provides higher precision with the same circuit complexity. That is to say, this present invention provides the same precision as the conventional circuit with much simpler circuit.

(2) This present invention reduces the circuit complexity and the number of elements utilized of a conventional circuit. It is useful for the precision control and the interference from the surroundings can be reduced therefore.

(3) This present invention reduces the number of switch elements utilized so that the noise caused by switching the switches is effectively reduced.

(4) This present invention greatly reduces the number of elements utilized so that the manufacture cost is decreased.

I claim:

1. A level-shift type digital-to-analog converter comprising:

(a) a selection circuit for converting original digital values to a plurality of digital codes for the digital-to-analog converter and then outputting the plurality of digital codes;

(b) a divided-step voltage output circuit connected to the selection circuit for receiving at least one of the plurality of the digital codes output from the selection circuit, and then outputting a voltage signal according to a predetermined number of steps and the voltage difference of each step;

(c) a level voltage output circuit connected to the selection circuit for receiving at least one of the plurality of digital codes output from the selection circuit, and then outputting a voltage signal according to a predetermined number of levels and the voltage difference of each level; and (d) a level-shift type buffer stage circuit connected to the divided-step voltage output circuit and the level voltage output circuit, for receiving and processing the output signals from the divided-step voltage output circuit and the level voltage output circuit, and outputting an analog voltage output signal in demand.

2. The level-shift type digital-to-analog converter according to claim 1, wherein the product of the number of the steps of the divided-step voltage output circuit multiplying the number of the steps of the level voltage output circuit is the number of steps of the analog voltage output signal in demand.

3. The level-shift type digital-to-analog converter according to claim 1, wherein a combination of the divided-step voltage output circuit and the level voltage output circuit and the level-shift type buffer stage circuit including:

a divided-step current output circuit connected to the selection circuit for receiving at least one of the plurality of the digital codes from the selection circuit and outputting a current signal according to a predetermined number of steps and the current difference between each step;

a level current output circuit connected to the selection circuit for receiving at least one of the plurality of digital codes from the selection circuit and outputting a current signal according to a predetermined number of levels and the current difference between each step;

a current/voltage conversion circuit connected to the divided-step current output circuit and the level current output circuit for receiving the current signals therefrom and then converting the current signals to a voltage value for a final output.

4. The level-shift type digital-to-analog converter according to claim 3, wherein the product of the number of the steps of the divided-step current output circuit multiplying the number of the steps of the level current output circuit is the number of steps of the analog voltage output signal in demand.

5. The level-shift type digital-to-analog converter according to claim 3, further comprising a buffer stage circuit for receiving and processing the voltage signal output from the current/voltage conversion circuit, and then outputting the analog voltage output signal in demand.

6. A level-shift type digital-to-analog converter for receiving digital output signals and generating analog output signals in demand through divided-step voltage output values and a level voltage output value and incorporated a level-shift type buffer stage, the converter including:

a decoder for receiving the digital input signals and then converting the signals to a format receivable by a voltage selection circuit;

a voltage level selection circuit for receiving the signals from the decoder and a multi voltage level generation circuit, and outputting divided-step output voltage values and level voltage output values provided for a level shift type buffer stage circuit;

the multiple voltage level generation circuit for generating a plurality of voltage levels for voltage level selection; and the level-shift type buffer stage circuit, for synthesizing the divided-step voltage and the level voltage from the voltage selection circuit and converting the synthesized signal to the analog output signal in demand.

7. The level-shift type digital-to-analog converter according to claim 6, wherein the multiple voltage level generation circuit is utilized for generating a plurality of voltages of different levels, and includes a serial circuit composed by a plurality of resistors in series, the two terminals of the resistors are connected between a high voltage level and a low voltage level.

8. The level-shift type digital-to-analog converter according to claim 6, wherein the voltage level selection circuit includes a plurality of switching elements controlled by the decoder so that the output terminals of the voltage level selection circuit respectively output appropriate amplitude s of divided-step voltage output values and the level voltage output values.

9. The level-shift type digital-to-analog converter according to claim 6, further including a stabilization circuit for generating at least a reference voltage or a reference current insensitive to the power supply voltage for providing to the circuit of the converter.

10. The level-shift type digital-to-analog converter according to claim 6, wherein the voltage level selection circuit includes a divided-step voltage selection circuit for outputting divided-step voltages and, a level voltage selection circuit for outputting the level voltage.

* * * * *